(12) United States Patent
Lee et al.

(10) Patent No.: US 8,664,753 B2
(45) Date of Patent: Mar. 4, 2014

(54) SEMICONDUCTOR DEVICE WITH PROTRUDING COMPONENT PORTION AND METHOD OF PACKAGING

(75) Inventors: Teck Sim Lee, Malacca (MY); Chee Voon Tan, Seremban (MY); Kwai Hong Wong, Perak (MY)

(73) Assignee: Infineon Technologies AG, Neubiberg (DE)

( * ) Notice: Subject to any disclaimer, the term of this patent is extended or adjusted under 35 U.S.C. 154(b) by 501 days.

(21) Appl. No.: 12/626,411

(22) Filed: Nov. 25, 2009

(65) Prior Publication Data

US 2011/0121439 A1 May 26, 2011

(51) Int. Cl.
*H01L 23/495* (2006.01)
*H01L 21/66* (2006.01)
*H01L 21/00* (2006.01)

(52) U.S. Cl.
USPC .............................. 257/676; 438/15; 438/127

(58) Field of Classification Search
USPC ................. 438/14–18, 106–27; 257/666–677
See application file for complete search history.

(56) References Cited

U.S. PATENT DOCUMENTS

| 5,625,221 | A | 4/1997 | Kim et al. |
| 6,776,663 | B2 | 8/2004 | Otremba et al. |
| 7,242,076 | B2 * | 7/2007 | Dolan ........................... 257/666 |
| 2001/0019856 | A1 * | 9/2001 | Takahashi et al. ............ 438/127 |
| 2001/0042915 | A1 | 11/2001 | Su et al. |
| 2003/0015775 | A1 * | 1/2003 | Minamio et al. .............. 257/676 |
| 2006/0157726 | A1 | 7/2006 | Loh et al. |
| 2009/0072334 | A1 * | 3/2009 | Saitoh ........................... 257/415 |

FOREIGN PATENT DOCUMENTS

DE 10055177 5/2002

* cited by examiner

*Primary Examiner* — Fernando L. Toledo
*Assistant Examiner* — Karen Kusumakar
(74) *Attorney, Agent, or Firm* — Dicke, Billig & Czaja, PLLC

(57) ABSTRACT

A semiconductor package device having a protruding component portion and a method of packaging the semiconductor device is disclosed. The semiconductor device has a component, such as a leadframe, and a packaging mold body. The packaging mold body is formed around a portion of the component and a recess is formed in the packaging mold body adjacent the protruding portion of the component to prevent the protruding portion of the component from damaging other adjacent and abutting semiconductor devices.

25 Claims, 3 Drawing Sheets

SEMICONDUCTOR DEVICE WITH PROTRUDING COMPONENT PORTION AND METHOD OF PACKAGING

FIELD OF THE INVENTION

This invention relates generally to a semiconductor device and method of packaging of a leadless semiconductor device, and more particularly to semiconductor device and method of packaging of a leadless semiconductor device having a protruding portion of the component, such as a leadframe, a tie bar or the like.

BACKGROUND

After cavity molding packaging of semiconductor devices, the semiconductor devices must be transported to undergo quality and performance checks and tests and to be prepared for shipping. Semiconductor devices are typically transported via handling tubes. Often, semiconductor devices are damaged during transport in the handling tube.

A source for damage caused to the semiconductor devices during transport is that conventional semiconductor devices, in particular leadless semiconductor devices such as quad flatpack package (QFP), typically have protruding portions that extend from the semiconductor device package. Examples of such a protruding portion include tie bars of the leadframe which extend through and protrude from the semiconductor device resin packaging material of the semiconductor device. The semiconductor device may have more than one protruding portion that may protrude from more than one side of the semiconductor device.

The protruding portions of a semiconductor device may knock and chip the adjacent semiconductor device in the handling tube. For example semiconductor device units may piggy back and cause units to jam in the handling tube. The protruding tie bar of each semiconductor device may chip the side wall of the adjacent semiconductor device. Accordingly, productivity and quality of singulation and testing (MSP) of conventional semiconductor devices has been hampered. For example, side wall chipping defects obtained during transport may make an otherwise finished and faultless semiconductor device defective.

Therefore, there is a need to overcome or at lease alleviate the above problems associated with conventional semiconductor devices.

BRIEF DESCRIPTION OF THE DRAWINGS

In order that embodiments of the invention may be fully and more clearly understood by way of non-limitative examples, the following description is taken in conjunction with the accompanying drawings in which like reference numerals designate similar or corresponding elements, regions and portions.

FIG. 1A-1C illustrates a semiconductor device having a protruding portion of a component such as a leadframe extending from the mold body of the semiconductor device in accordance with one embodiment in top plan view (FIG. 1A), the region of the protruding portion of the leadframe in greater detail (FIG. 1B), and a cross section of FIG. 1A is provided to show the tie bar and leads of the leadframe (FIG. 1C).

Figure 2A:
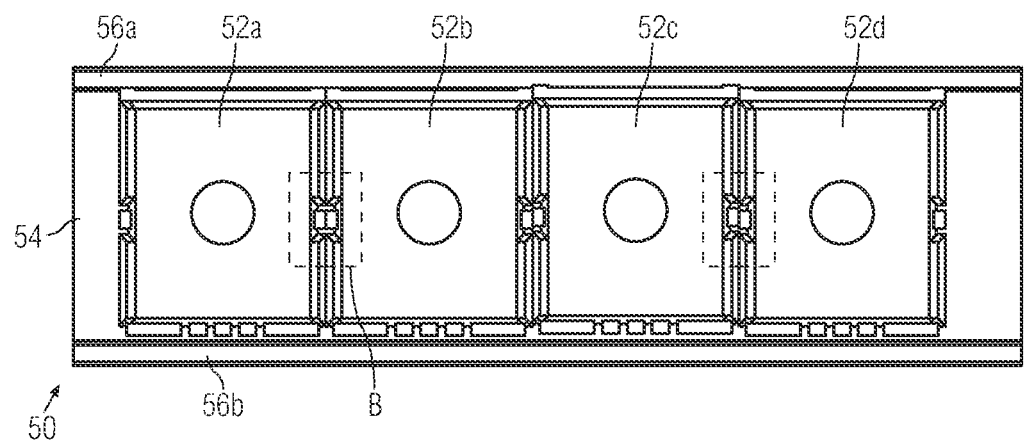
FIG. 2A-2B illustrates a plan view of a plurality of semiconductor devices that are each in accordance with an embodiment the invention in a handling tube (FIG. 2A)
Figure 2B:
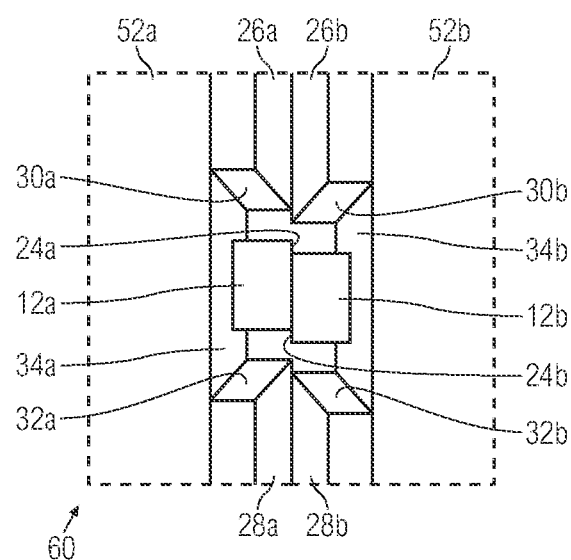

2 the area of contact at the protruding portion of the leadframe is illustrated in more detail (FIG. 2B).

Figure 3:
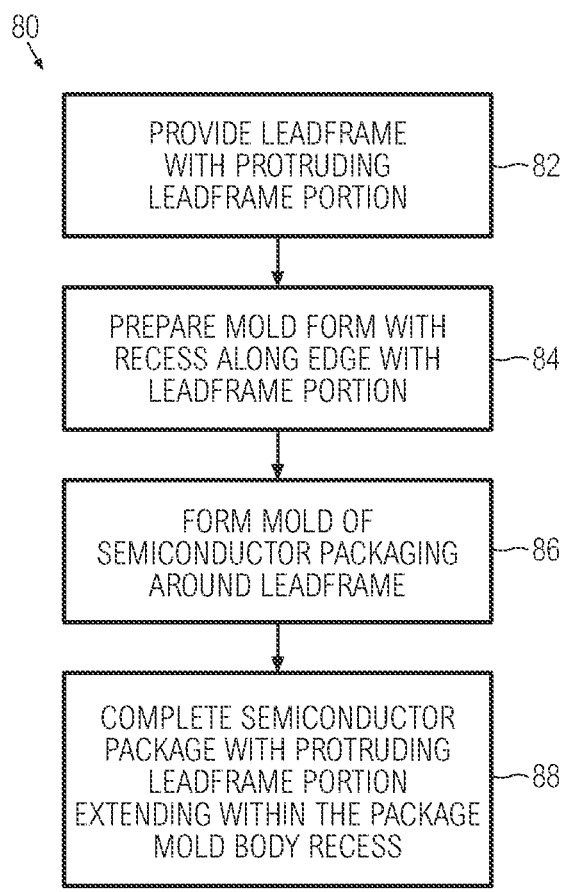

FIG. 3 is a flow chart of a method in accordance with one embodiment.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment provides a semiconductor package device including a component and a mold body, the mold body is formed around a portion of the component, and the component has a portion protruding from the mold body. The mold body has a recess adjacent the protruding portion of the component, and the protruding portion of the component extends within an area formed by the recess in the mold body.

In one embodiment, the area of the recess is formed between a first plane formed by a first edge of the mold body and a second edge of the mold body adjacent to the recess, and a second plane formed by a bottom side of the recess adjacent to the protruding portion of the component. The first plane and second plane may be parallel. The protruding portion of the component may have a top side that is aligned with the first plane. The protruding portion of the component may have a top side that is misaligned with the first plane. The protruding portion of the component may have a top side that is parallel with the first plane. The recess may be formed of at least one side formed by edges of the mold body having at least one side. The recess may be formed by at least one side and a bottom side formed by edges of the mold body adjacent to the protruding portion. The recess may be formed by at least two sides formed by edges of the mold body. The recess may be formed by at least four sides formed by edges of the mold body. The recess may be formed by at least two internal edges of the mold body.

One embodiment provides a method of packaging a semiconductor device having a component and a mold body around a portion of the component, the method comprises providing a component with a protruding portion; preparing a mold form with a recess along the edge adjacent to the protruding portion of the component; and forming the mold body of the semiconductor device where the protruding portion of the component extends within the area formed of the recess in the mold body.

Figure 1C:
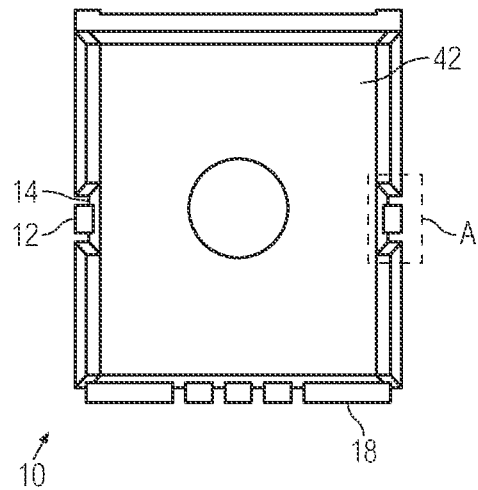
Figure 1C:
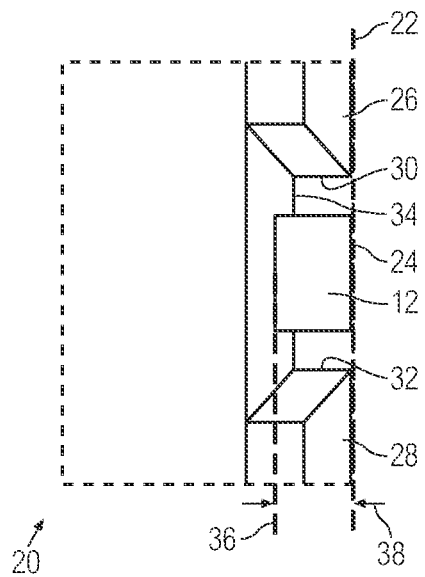
Figure 1C:
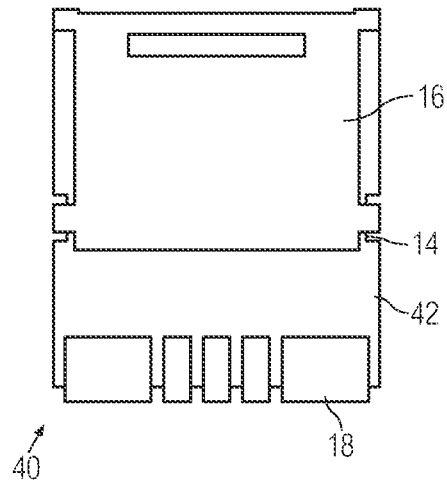

With reference to FIG. 1A-1C, a top plan view of a semiconductor device 10 having a protruding portion 12 of a component such as a leadframe in accordance with one embodiment is illustrated in FIG. 1A. The semiconductor device includes a plurality of devices and components. Such components may be for example a leadframe 16 with tie bar 12, frames, support leads, die pads and leads 18 as illustrated in FIG. 1C of the cross-sectional view 40 of the semiconductor device illustrated in FIG. 1A. The semiconductor device may have other components such as semiconductor chip having a circuit system and a plurality of electrodes for wire bonding connection and forming the desired circuit. The components of the semiconductor device are sealed with a packaging material such as a resin packaging material 42 which seals, protects and maintains the semiconductor device components together.

The resin packaging material of the mold body 42 of the semiconductor device seals the semiconductor device components together with cavity mold process having upper mold and lower mold pressed together to form a cavity for the resin packaging material to flow and fill the cavity when the resin packaging material is in liquid form. The process of fabricating the semiconductor device is shown in FIG. 3 the flow chart of the method 80 in accordance with one embodiment. After providing the leadframe with the protruding portion such as a tie bar 82, the molds are arranged 84 to form 86 the mold body 42 of the semiconductor device with a recess 14 in accordance with one embodiment. After the resin packaging material is hardened, the molds are removed from the semiconductor device. The semiconductor device package is completed 88 with the top side or edge 24 of the protruding tie bar in line with the plane formed by an edge 26,28 of the package mold body 42.

In accordance with one embodiment of the invention, the recess 14 is formed in a side wall of the semiconductor device during the packing process. The molds (not illustrated) used in the mold cavity process have the shape to form the desired recess. However, it will be appreciated that the recess may be arranged on any wall or edge of the mold body of the semiconductor device.

Referring to FIG. 1B, which illustrates region A illustrated in FIG. 1A in more detail 20, the tie bar 12 forms part of the leadframe and extends through the packaging material 42 and protrudes from the packaging material from the bottom side 34 of the recess 14. The recess is formed by an internal side wall 30,32 of the semiconductor mold body.

In defining the recess, a first plane 22 is formed by the side edge of semiconductor mold body adjacent the recess 14. For example the first and second side edges 26,28 form the first plane 22. The first plane may be formed by only one side edge such as the first side edge 26, for example the recess and the protruding leadframe portion may be placed at a corner or end of the semiconductor device and there may only be one side edge adjacent the recess.

The side wall 30,32 may take different forms and any number of side walls may be formed. For example, the side wall may be one side wall form having a constant radius to form a circular wall to completely or partially surround the protruding portion of the leadframe. Other shapes of the side wall may be curving free form shape and the like. Other configurations of side walls may be configured such as the two sidewalls 30,32 as shown in FIG. 1A. Of course more than two sidewalls may be used for example three, four or more. The sidewalls of the recess may be configured to completely or partially surround the protruding portion of the leadframe. In FIG. 1A-1C the two side walls 30,32 are configured to only partially shield or surround the protruding portion of the leadframe 14.

The sidewalls may form right angles with respect to the side edge 26,28 of the semiconductor mold body forming the first plane and/or the bottom of the recess. The sidewalls may form other angles with respect to the side edges 26,28 of the mold body and the bottom 34 of the recess. Additionally, the recess may be arranged to have no bottom 34, and instead have the recess form a notch "V" shape with slanted side wall or walls 26,28 that form directly from the protruding portion of the leadframe to the side edge 26,28.

The second plane 36 formed by the bottom 34 of the recess may be defined by the points on either side of the protruding portion of the leadframe where the edge of the mold body intersects the protruding portion of the leadframe. In an embodiment where there is no bottom 34 as such, and the recess forms a notch, the points where the portion of the leadframe protrudes from the edge of the mold body around different points of the protruding portion of the leadframe is used to define the second plane. The area of the recess is determined by the distance 38 between the two planes. The distance 38 may be the distance between the plane formed by bottom of intrusion and the plane formed by two edges. In an embodiment the two planes are parallel. In other embodiments, the two planes may be unparallel.

The protruding portion of the leadframe may have a cut length which is 80% of the leadframe thickness. Different configurations may be arranged, and the tie bar may be trimmed accordingly. In one embodiment, semiconductor design rules provide for a design where the protruded length of the tie bar is 80% of the leadframe thickness. This is to ensure the minimum safety clearance to minimize the risk of delamination in package caused by simulation. If for example the leadframe thickness is 0.50 mm, the semiconductor design rules would provide for the length of the protruded portion of the leadframe to be 0.40 mm.

The protruding portion of the leadframe has a top surface or edge 24 that may be aligned and be parallel with the first plane 22 and the second plane 36. The top surface or edge 24 of the protruding portion may intersect the first plane 22. The protruding portion of the leadframe does not extend from the recess beyond the first plane 22 in accordance with embodiments. The protruding portion of the leadframe only extends within the area of the recess.

In one or more embodiments, the protruding portion 12 of the leadframe 16 may have different lengths and may extend from the bottom point 34 of the recess 14, however, may not extend fully to be aligned with the first plane 22. The top edge 24 of the protruding portion 12 may not be parallel with the first and/or second plane, and may not be aligned with the first plane. Also, the semiconductor device may have more than one recess with a protruding portion of the leadframe. There may be more than one recess alone one edge of the semiconductor device and/or along more than one side of the semiconductor device.

Referring to FIG. 2A-2B, a plan view of a plurality of semiconductor devices 52a,52b,52c,52d in accordance with one or more embodiments are illustrated in a track 54 of a handling tube 50 is shown in FIG. 2A. The track has rails 56a,56b that maintain the semiconductor devices in the track. As the protruding portion of the leadframe 12 does not extend beyond the first plane 22, and the depth of the recess 14 is deeper than the length of the protruding portion of the leadframe, the protruding portions of the leadframe do not chip the adjacent semiconductor device in the handling tube 50.

The dashed box B is the region shown in more detail 60 in FIG. 2B of abutting adjacent semiconductor devices 52a,52b with protruding portions of leadframe 12a,12b. The top edge 24a,24b of each of the protruding portions of the leadframe do not extend beyond the first plane and therefore do not cause any damage to the other respective adjacent semiconductor devices. In this embodiment, each recess is defined by first and second external edges 26a,26b,28a,28b adjacent to each recess, first and second internal side walls 30a,30b,32a,32b, and bottom of recess 34a,34b.

The one or more embodiments prevent or at least alleviate the occurrence of semiconductor units from jamming or causing piggy back within a handling tube during transport of a plurality of semiconductor devices. Embodiments also prevent chipping of side walls from adjacent abutting semiconductor devices. Additionally, in implementing the recess design of the mold body in the packaging process of the semiconductor device, the leadframe design can be maintained. The design of the leadframe does not need to be redesigned to implement embodiments of the invention and the package molded outline and die pad size is maintained. Further, the trimming of the tie bar and molding of the recess fulfill and comply with semiconductor design rules. The recess design is implemented in the molds for the mold cavity process and therefore the leadframe design does not need to be altered.

While embodiments have been described and illustrated, it will be understood by those skilled in the technology concerned that many variations or modifications in details of design or construction may be made without departing from the present invention.

The invention claimed is:

1. A semiconductor package device comprising:
    a component;
    a mold body, the mold body formed around a portion of the component, the component having a portion protruding from the mold body, the mold body having a recess formed in a side wall of the mold body, the protruding portion of the component extending only within an area formed of the recess such that a sidewall of the recess partially surrounds the protruding portion of the component,
    wherein the sidewall of the recess is spaced apart from the protruding portion of the component.

2. The semiconductor package device of claim 1 wherein the area of the recess is formed between a first plane formed by a first edge of the mold body and a second edge of the mold body adjacent to the recess, and a second plane formed by a bottom side of the recess adjacent to the protruding portion of the component, and
    wherein the protruding portion of the component does not extend from the recess beyond the first plane.

3. The semiconductor package device of claim 2 wherein the first plane and second plane are parallel.

4. The semiconductor package device of claim 2 wherein the protruding portion of the component has a top side that is aligned with the first plane.

5. The semiconductor package device of claim 2 wherein the protruding portion of the component has a top side that is misaligned with the first plane.

6. The semiconductor package device of claim 2 wherein the protruding portion of the component has a top side that is parallel with the first plane.

7. The semiconductor package device of claim 1 wherein the recess is formed at least one side formed by edges of the mold body having at least one side.

8. The semiconductor package device of claim 7 wherein the recess is formed by at least one side and a bottom side formed by edges of the mold body adjacent to the protruding portion.

9. The semiconductor package device of claim 7 wherein the recess is formed by at least two sides formed by edges of the mold body.

10. The semiconductor package device of claim 7 wherein the recess is formed by at least four sides formed by edges of the mold body.

11. The semiconductor package device of claim 7 wherein the recess is formed by at least two internal edges of the mold body.

12. The semiconductor package device of claim 1 wherein the component is a leadframe.

13. A method of packaging a semiconductor device having a component and a mold body around a portion of the component, the method comprises:
    providing a component with a protruding portion;
    preparing a mold form with a recess along the edge adjacent to the protruding portion of the component; and
    forming the mold body of the semiconductor device where the protruding portion of the component extending only within an area formed of the recess formed in a side wall of the mold body such that a sidewall of the recess partially surrounds the protruding portion of the component,
    wherein the sidewall of the recess is spaced apart from the protruding portion of the component.

14. The method of claim 13 wherein the area of the recess is formed between a first plane formed by a first edge of the mold body and a second edge of the mold body adjacent to the recess, and a second plane formed by a bottom side of the recess adjacent to the protruding portion of the component, and
    wherein the protruding portion of the component does not extend from the recess beyond the first plane.

15. The method of claim 14 wherein the first plane and second plane are parallel.

16. The method of claim 14, including aligning a top side of the protruding portion of the component with the first plane.

17. The method of claim 14 wherein the protruding portion of the component has a top side that is misaligned with the first plane.

18. The method of claim 14 wherein the protruding portion of the component has a top side that is parallel with the first plane.

19. The method of claim 13 including forming at least one side of the recess by edges of the mold body having at least one side.

20. The method of claim 19 wherein the recess is formed by at least one side and a bottom side formed by edges of the mold body adjacent to the protruding portion.

21. The method of claim 19 wherein the recess is formed by at least two sides formed by edges of the mold body.

22. The method of claim 19 wherein the recess is formed by at least four sides formed by edges of the mold body.

23. The method of claim 19 wherein the recess is formed by at least two internal edges of the mold body.

24. The method of claim 13 wherein the component is a leadframe.

25. A semiconductor package comprising:
    a handling tube; and
    a semiconductor package device positioned in the handling tube including a component, and
    a mold body, the mold body formed around a portion of the component, the component having a portion protruding from the mold body, the mold body having a recess formed in a side wall of the mold body, the protruding portion of the component extending only within an area formed of the recess such that a sidewall of the recess partially surrounds the protruding portion of the component; and
    at least one additional semiconductor package device positioned in the handling tube, wherein the sidewall of the recess is spaced apart from the protruding portion of the component.

* * * * *